(12) United States Patent
Shirasawa et al.

(10) Patent No.: US 6,819,149 B2
(45) Date of Patent: Nov. 16, 2004

(54) GATE DRIVE DEVICE FOR REDUCING A SURGE VOLTAGE AND SWITCHING LOSS

(75) Inventors: Takaaki Shirasawa, Tokyo (JP); Tsuyoshi Takayama, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/457,348

(22) Filed: Jun. 10, 2003

(65) Prior Publication Data

US 2004/0145407 A1 Jul. 29, 2004

(30) Foreign Application Priority Data

Jan. 24, 2003 (JP) ........................................ 2003-015817

(51) Int. Cl.[7] .............................................. H03K 17/04
(52) U.S. Cl. ........................ 327/112; 327/376; 327/377
(58) Field of Search ................................ 327/112, 108, 327/376, 377, 409, 410; 326/85, 86, 87, 91

(56) References Cited

U.S. PATENT DOCUMENTS

| 5,905,370 A | * | 5/1999 | Bryson | ........................ 323/283 |
|---|---|---|---|---|
| 6,281,718 B1 | * | 8/2001 | Page et al. | .................... 327/106 |
| 6,362,683 B1 | * | 3/2002 | Miao et al. | ..................... 330/10 |
| 6,486,816 B2 | * | 11/2002 | Seymour | ..................... 341/150 |
| 6,653,878 B2 | * | 11/2003 | Nolan | ......................... 327/170 |

FOREIGN PATENT DOCUMENTS

JP       2001-24492       1/2001

* cited by examiner

Primary Examiner—Tuan T. Lam
Assistant Examiner—Hiep Nguyen
(74) Attorney, Agent, or Firm—Oblon, Spivak, McClelland, Maier & Neustadt, P.C.

(57) ABSTRACT

In a circuit having MOS transistors connected in series, a surge voltage that occurs during off periods is reduced, while suppressing an increase in switching loss at turning off of the MOS transistors. When a first power MOSFET (1) is turned off and then a second power MOSFET (2) is turned on after that according to predetermined timing, the first power MOSFET (1) is temporarily placed in an on state for a predetermined time period synchronized with that predetermined timing. On the other hand, when the second power MOSFET (2) is turned off and then the first power MOSFET (1) is turned on after that according to predetermined timing, the second power MOSFET (2) is temporarily placed in an on state for a predetermined time period synchronized with that predetermined timing.

7 Claims, 13 Drawing Sheets

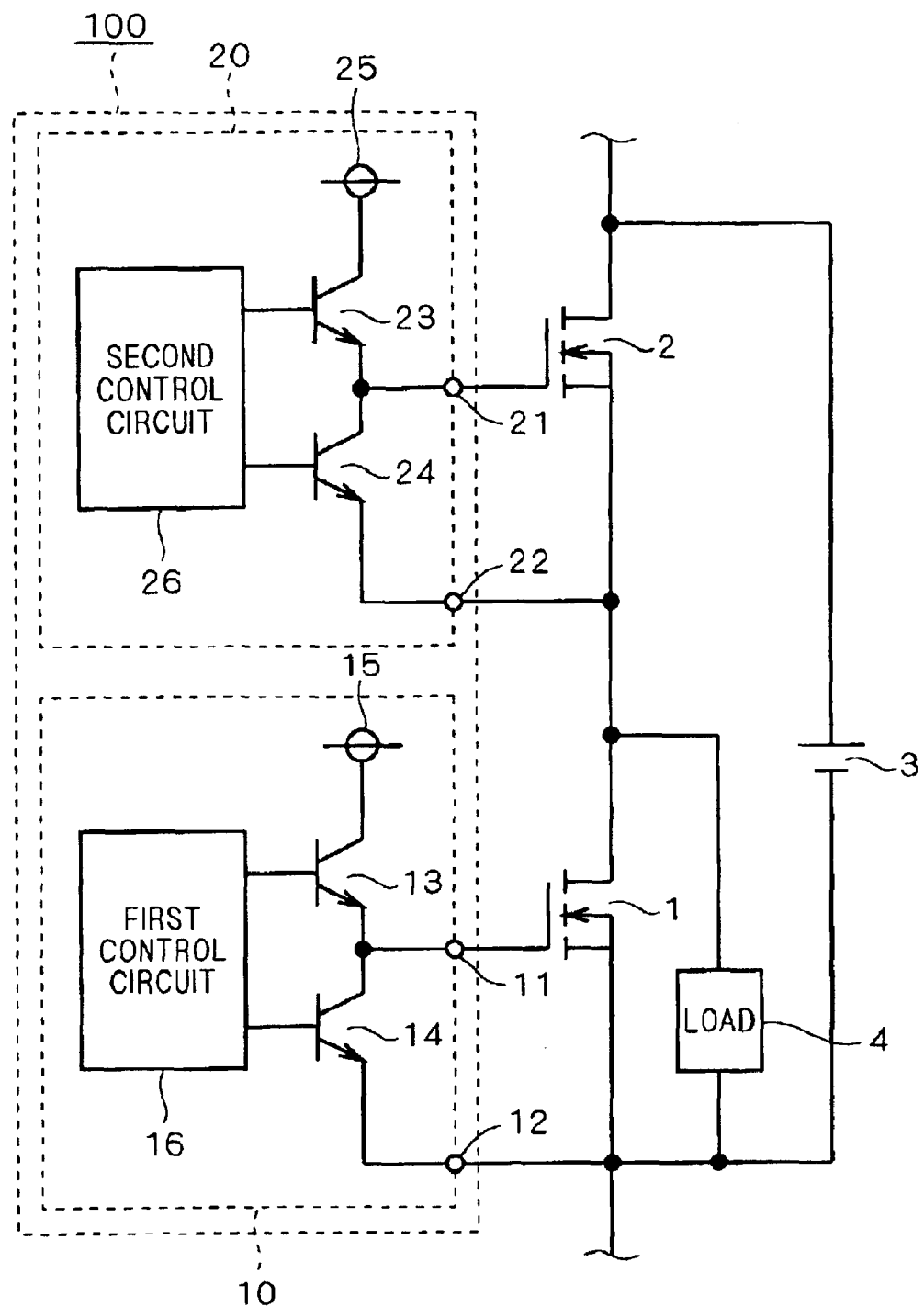
F I G . 1

F I G. 6
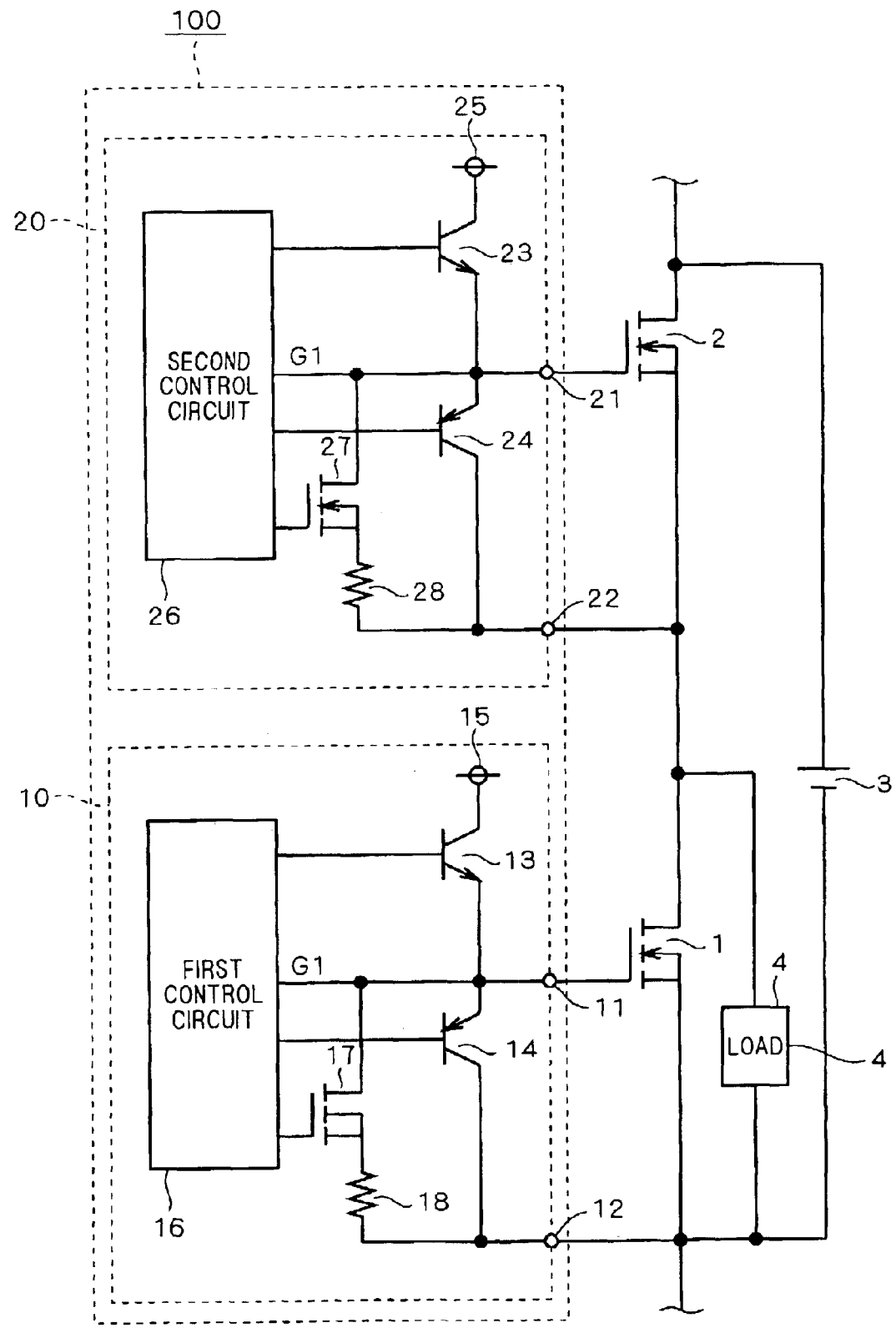

F I G . 1 0
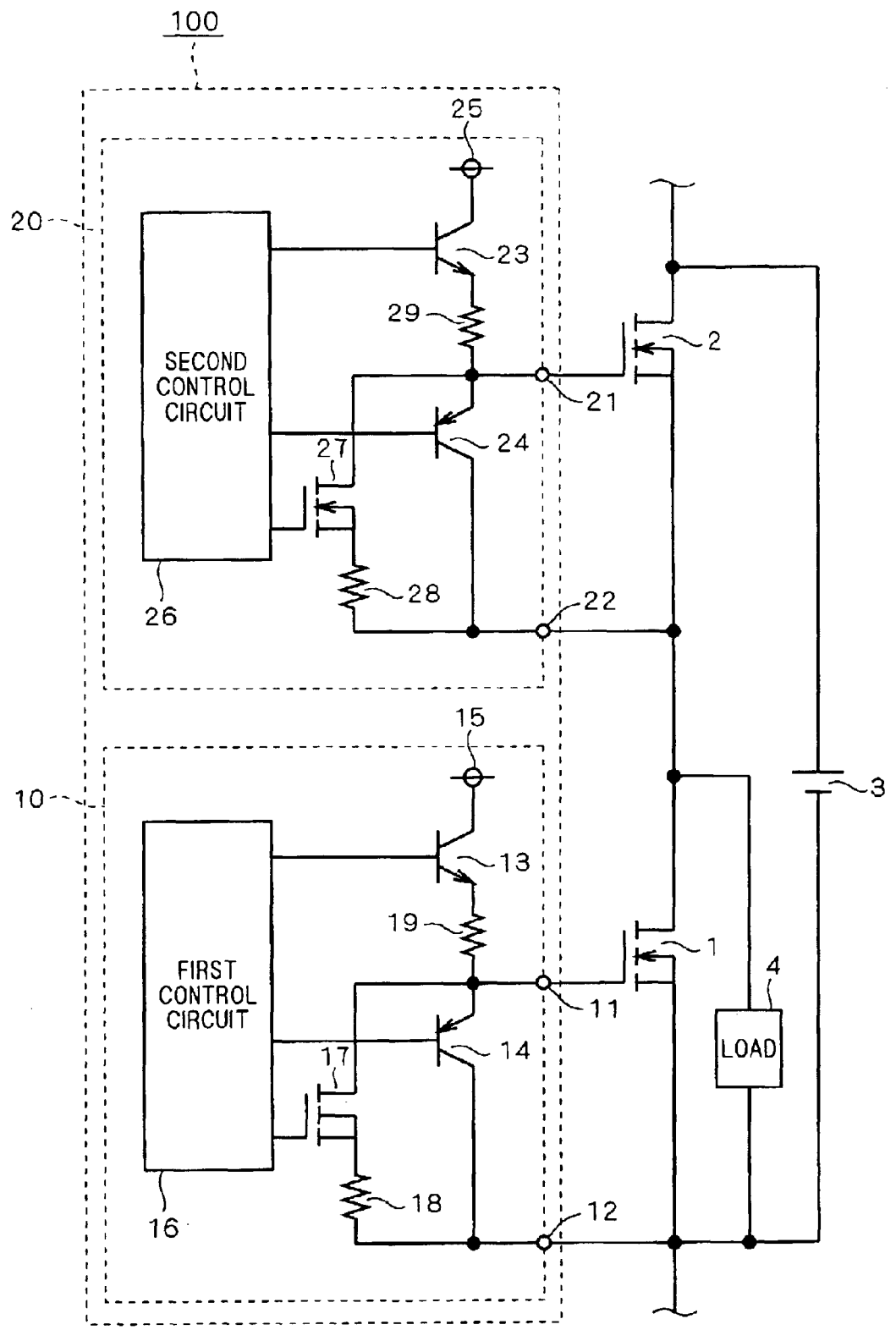

F I G . 1 1
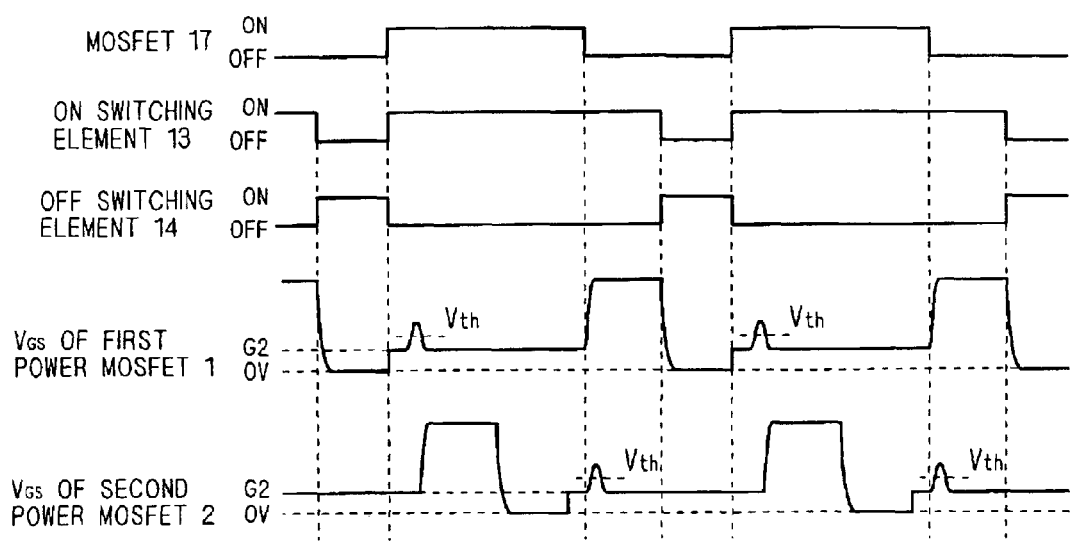

F I G . 1 4
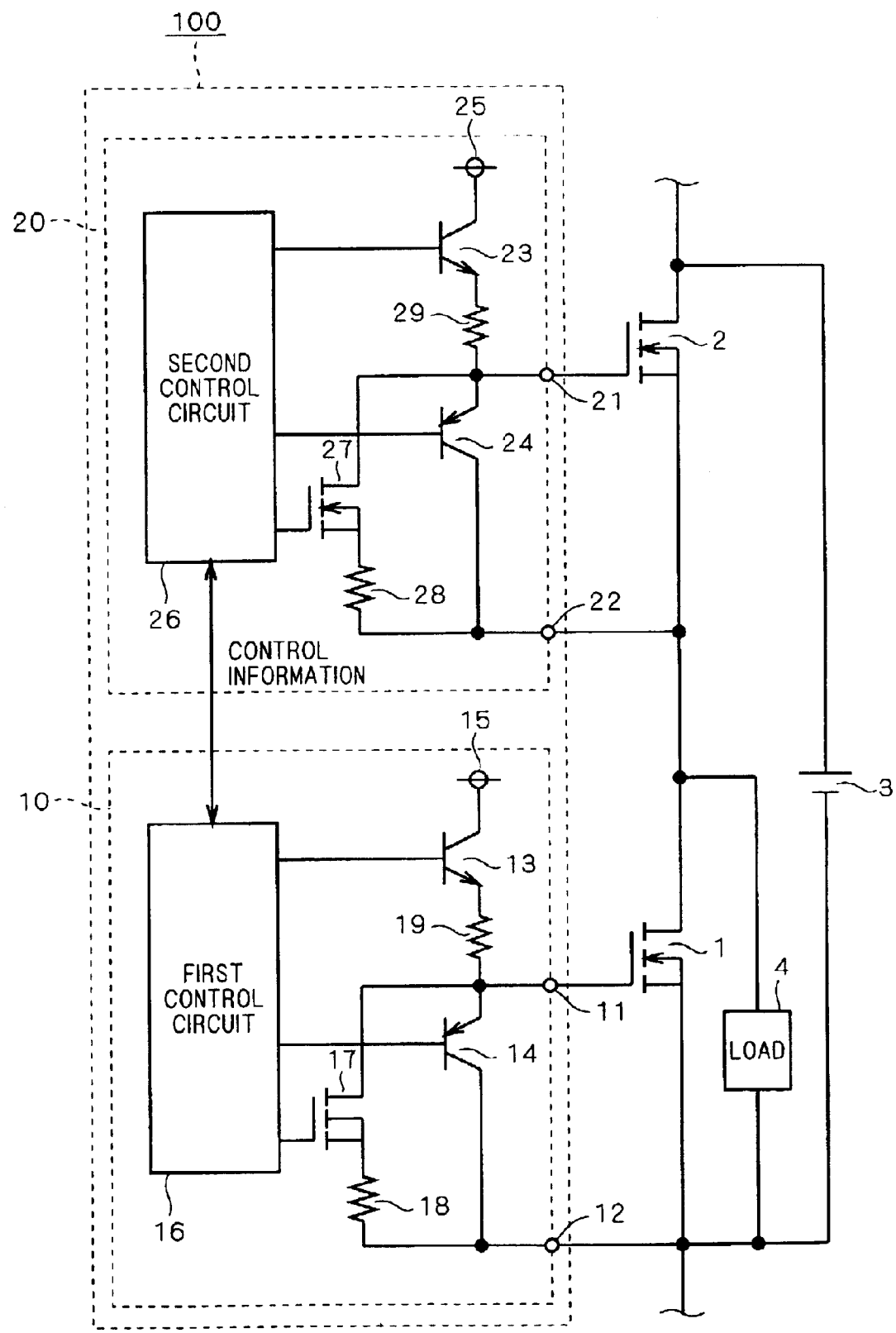

GATE DRIVE DEVICE FOR REDUCING A SURGE VOLTAGE AND SWITCHING LOSS

BACKGROUND OF THE INVENTION

1. Field of the Invention

The present invention relates to a gate drive device for driving MOS transistors, and particularly to a gate drive device for driving electric power MOS transistors (power MOS transistors).

2. Description of the Background Art

Nowadays, inverter circuits are used as AC motor driving circuits. Such inverter circuits use power MOS transistors.

In such an inverter circuit having power MOS transistors, when an MOS transistor connected with an inductive load, e.g. a motor, turns off, then a recovery surge voltage (hereinafter referred to as a surge voltage) appears between its main electrodes (between the collector and emitter). In general, such a surge voltage is likely to become large because of poor recovery characteristics of the parasitic diode in the power MOS transistor. The surge voltage may possibly lead to breakage of the power MOS transistor. Accordingly, power MOS transistor drive circuits capable of reducing the surge voltage have been suggested (for example, refer to Japanese Patent Application Laid-Open No. 2001-24492, pp. 3–5, FIGS. 1–6).

In the drive circuit shown in this reference, a diode is interposed between the source terminal of a power MOS transistor and an off switching circuit connected to its gate terminal. Then, when gate charge is drawn out through the off switching circuit to turn off the power MOS transistor, the gate-source voltage is kept at a predetermined value (the forward voltage of the diode). That is to say, a certain level of charge remains between the gate and source because of the diode forward voltage, and it is then possible to lower the level of the surge voltage that is caused by charging of the capacitance component of the power MOS transistor.

Now, surge voltage may occur also during off periods of power MOS transistors. For example, in an inverter having two series-connected power MOS transistors, when one power MOS transistor turns off and then the other power MOS transistor turns on after that, a recovery phenomenon occurs in the parasitic diode in said one power MOS transistor being off, causing a surge voltage between the collector and emitter of that power MOS transistor.

This surge voltage can be reduced by the drive circuit described in the reference shown above. However, the insertion of a diode between the off switching circuit and the source terminal deteriorates the gate charge extraction characteristic of the power MOS transistor, leading to a large switching loss at turning off.

SUMMARY OF THE INVENTION

Concerning a circuit having series-connected MOS transistors, such as an inverter circuit, an object of the present invention is to provide a gate drive device capable of reducing a surge voltage that occurs during off periods, while suppressing an increase in switching loss when the MOS transistors turn off.

According to a first aspect of the invention, a gate drive device drives first and second MOS transistors that are series-connected to each other. In the drive device, when one of the first and second MOS transistors is turned off and then the other is turned on after that with a predetermined timing, the one MOS transistor is temporarily placed in an on state for a predetermined time period that is synchronized with the predetermined timing.

According to a second aspect of the invention, a gate drive device has a drive circuit for driving an MOS transistor. The drive circuit includes first and second terminals that are connectable respectively to a gate and a source of the MOS transistor, first and second voltage sources, first to third switching elements and a resistor, and a control circuit for controlling the first to third switching elements and the second voltage source. The first voltage source supplies a driving voltage for driving the MOS transistor. The second voltage source is connected to the first terminal and supplies a predetermined voltage that is less than a threshold voltage at which the MOS transistor turns on. The first switching element is connected between the first voltage source and the first terminal. The second switching element is connected between the first terminal and the second terminal. The third switching element and the resistor are series-connected to each other and parallel-connected to the second switching element. After turning off the first switching element and turning on the second switching element, and according to a predetermined timing and for a predetermined time period, the control circuit temporarily places the first and second switching elements in an off state and the third switching element in an on state and applies the predetermined voltage from the second voltage source to the first terminal.

According to a third aspect of the invention, a gate drive device has a drive circuit for driving an MOS transistor. The drive circuit includes first and second terminals that are connectable respectively to a gate and a source of the MOS transistor, a voltage source, first to third switching elements, first and second resistors, and a control circuit for controlling the first, second, and third switching elements.

The voltage source supplies a driving voltage for driving the MOS transistor. The first switching element and the first resistor are series-connected to each other and connected between the voltage source and the first terminal. The second switching element is connected between the first terminal and the second terminal. The third switching element and the second resistor are series-connected to each other and parallel-connected to the second switching element. After turning off the first switching element and turning on the second switching element, and according to a predetermined timing and for a predetermined time period, the control circuit temporarily places the first and third switching elements in an on state and places the second switching element in an off state.

When one of the first and second MOS transistors is turned off and then the other is turned on after that with a predetermined timing, the one MOS transistor is temporarily placed in an on state for a predetermined time period that is synchronized with the predetermined timing. This reduces the surge voltage that takes place in the one MOS transistor as the other MOS transistor turns on. Also, since no diode is interposed between the gate and source of the first and second MOS transistors, an increase in switching loss can be prevented when they turn off.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing the configuration of a gate drive device according to a first preferred embodiment;

FIG. 6 is a diagram showing the configuration of a gate drive device according to a third preferred embodiment;

FIG. 10 is a diagram showing the configuration of a gate drive device according to a fifth preferred embodiment;

FIG. 11 is a diagram used to describe operation of the gate drive device of the fifth preferred embodiment;

FIG. 14 is a diagram showing a modification of the gate drive device of the sixth preferred embodiment.

DESCRIPTION OF THE PREFERRED EMBODIMENTS

<First Preferred Embodiment>

Figure 2:
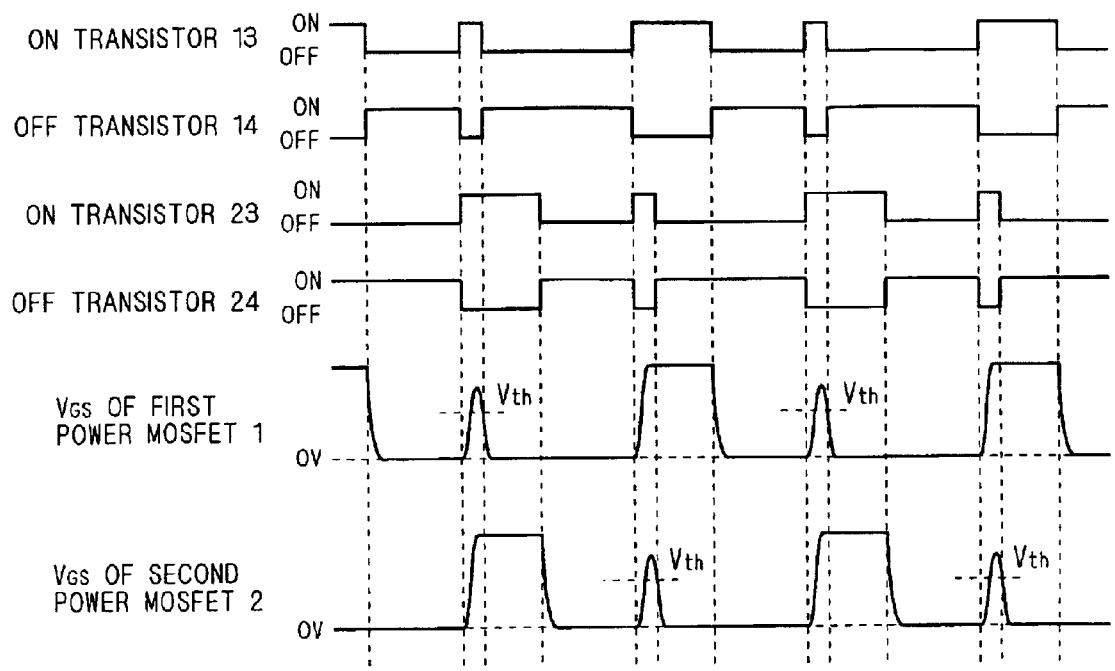
FIG. 2 is a diagram used to describe operation of the gate drive device of the first preferred embodiment.

FIG. 1 is a circuit diagram showing the configuration of a power MOS transistor gate drive device according to a first preferred embodiment of the present invention; FIG. 1 shows a one-phase portion of a 3-phase 6-element inverter using MOSFETs as power MOS transistors. A first power MOSFET 1 and a second power MOSFET 2 are connected in series to each other to form an inverter circuit for switching a main power-supply 3. A load 4, e.g. a motor, is parallel-connected to the first power MOSFET 1. The gate drive device 100 includes a first drive circuit 10 and a second drive circuit 20. The first power MOSFET 1 and the second power MOSFET 2 are driven by the first drive circuit 10 and the second drive circuit 20, respectively.

The first drive circuit 10 has a gate connection terminal 11 connected to the gate of the first power MOSFET 1 to be driven, a source connection terminal 12 connected to its source, and a driving voltage source 15 for supplying a driving voltage to the gate of the first power MOSFET 1 to turn it on.

An ON transistor 13, as a first switching element, is connected between the driving voltage source 15 and the gate connection terminal 11, and an OFF transistor 14 as a second switching element is connected between the gate connection terminal 11 and the source connection terminal 12. A first control circuit 16 controls the switching on/off of the ON transistor 13 and OFF transistor 14 to switch the voltage applied to the gate connection terminal 11 between the driving voltage supplied from the driving voltage source 15 and the voltage at the source connection terminal 12 (i.e. the source voltage of the first power MOSFET 1).

When the first control circuit 16 turns on the ON transistor 13 and turns off the OFF transistor 14, then the driving voltage from the driving voltage source 15 is applied to the gate connection terminal 11 and the first power MOSFET 1 turns on (a conducting state). On the other hand, when it turns off the ON transistor 13 and turns on the OFF transistor 14, then the voltage at the source connection terminal 12 is applied to the gate connection terminal 11 and the first power MOSFET 1 turns off (a non-conducting state). That is to say, the first control circuit 16 alternately turns on the ON transistor 13 and OFF transistor 14 to drive the first power MOSFET 1.

As can be seen from FIG. 1, the second drive circuit 20 has almost the same configuration as the first drive circuit 10. That is to say, the second drive circuit 20 has a gate connection terminal 21 connected to the gate of the second power MOSFET 2 to be driven, a source connection terminal 22 connected to its source, and a driving voltage source 25 for supplying a driving voltage to the gate of the second power MOSFET 2 to turn it on.

An ON transistor 23, as a first switching element, is connected between the driving voltage source 25 and the gate connection terminal 21, and an OFF transistor 24 as a second switching element is connected between the gate connection terminal 21 and the source connection terminal 22. A second control circuit 26 controls the switching on/off of the ON transistor 23 and OFF transistor 24 to switch the voltage applied to the gate connection terminal 21 between the driving voltage supplied from the driving voltage source 25 and the voltage at the source connection terminal 22 (i.e. the source voltage of the second power MOSFET 2). That is to say, the second control circuit 26 alternately turns on the ON transistor 23 and the OFF transistor 24 to drive the second power MOSFET 2.

FIG. 2 is a diagram used to describe the operation of the gate drive device 100 of this preferred embodiment. The operation of the gate drive device 100 of this preferred embodiment is now described referring to FIG. 2.

First, in the first drive circuit 10, as shown in FIG. 2, the first control circuit 16 turns off the ON transistor 13 and turns on the OFF transistor 14, and then the gate-source voltage ($V_{GS}$) of the first power MOSFET 1 becomes 0 V and the first power MOSFET 1 thus turns off. Subsequently, in the second drive circuit 20, the second control circuit 26 turns on the ON transistor 23 and turns off the OFF transistor 24 according to predetermined timing, so as to turn on the second power MOSFET 2.

Then, with the same timing, the first control circuit 16 in the first drive circuit 10 temporarily turns on the ON transistor 13 and turns off the OFF transistor 14, so that the gate-source voltage of the first power MOSFET 1 exceeds the threshold voltage $V_{th}$. That is to say, in synchronization with the timing of the turning on of the second power MOSFET 2, the first power MOSFET 1 is placed in an on state only for a short time period including that point of time. Therefore, the free-wheeling current that takes place as the second power MOSFET 2 turns on flows not into the parasitic diode portion of the first power MOSFET 1 but into its transistor portion, and so the surge voltage occurring between the source and drain of the first power MOSFET 1 is reduced.

Furthermore, unlike in the structure shown in the reference previously mentioned, no diode is interposed between the ON transistor 13 and the source of the first power MOSFET 1 (the source connection terminal 12), and therefore the gate charge extraction characteristic of the first power MOSFET 1 is not deteriorated. That is, as shown in FIG. 2, the gate-source voltage of the first power MOSFET 1 quickly drops to 0 V as the ON transistor 13 turns off and the OFF transistor 14 turns on. This prevents increased switching loss at the time that the first power MOSFET 1 turns off. Preferably, in order to further suppress an increase in loss at the first power MOSFET 1, the length of the aforementioned short time period is set to about several tens of nanoseconds (nS) to one microsecond (μS) and $V_{GS}$ exceeds the threshold $V_{th}$ by about 0.1 V in this period.

Next, the ON transistor 23 in the second drive circuit 20 turns off and the OFF transistor 24 turns on, so as to turn off the second power MOSFET 2. After that, according to predetermined timing, the first control circuit 16 turns on the ON transistor 13 and turns off the OFF transistor 14, so as to turn on the first power MOSFET 1.

Then, with the same timing, the second control circuit 26 temporality turns on the ON transistor 23 and turns off the OFF transistor 24, causing the gate-source voltage of the second power MOSFET 2 to increase over the threshold voltage $V_{th}$. That is to say, in synchronization with the timing of the turning on of the first power MOSFET 1, the second power MOSFET 2 is placed in an on state for only a short time period including that point of time. Therefore, the free-wheeling current that takes place as the first power MOSFET 1 turns on flows not into the parasitic diode portion of the second power MOSFET 2 but into its transistor portion, and so the surge voltage occurring between the source and drain of the second power MOSFET 2 is reduced.

Furthermore, since no diode is interposed between the ON transistor 23 and the source of the second power MOSFET 2 (the source connection terminal 22), the gate charge extraction characteristic of the second power MOSFET 2 is not deteriorated. This prevents an increase in switching loss at the time the second power MOSFET 2 turns off. In this case, too, in order to further suppress the increase in loss at the second power MOSFET 2, the length of the aforementioned short time period is preferably set to about several tens of nanoseconds (nS) to one microsecond (μS) and $V_{GS}$ preferably exceeds the threshold $V_{th}$ by about 0.1 V in this period.

In this way, the gate drive device 100 of this preferred embodiment operates so that, when one of the first power MOSFET 1 and the second power MOSFET 2 is turned off and then the other is turned on after that with a predetermined timing, said one MOSFET temporarily turns on in synchronization with that timing for a predetermined short time period including that point of time. This reduces the surge voltage occurring at that one power MOSFET as the other MOSFET turns on. Furthermore, increases in switching loss at turning off of the first power MOSFET 1 and second power MOSFET 2 can be prevented since no diode is interposed between the OFF transistor 14 and the source connection terminal 12 and between the OFF transistor 24 and the source connection terminal 22.

Figure 3:
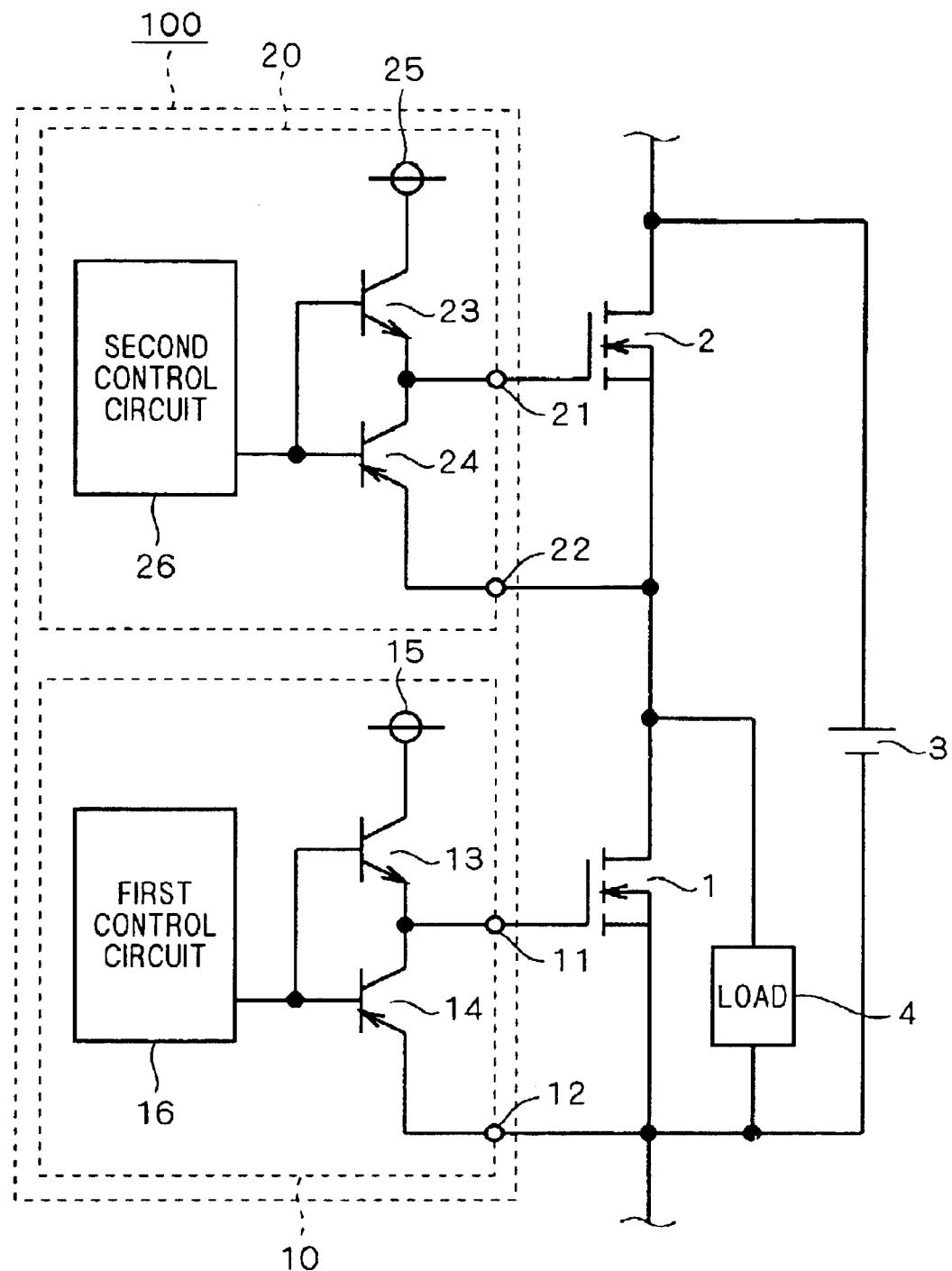
FIG. 3 is a diagram showing a modification of the gate drive device of the first preferred embodiment.

The description above has shown a structure in which the first control circuit 16 controls the ON transistor 13 and OFF transistor 14 with separate control signals. However, the two transistors may be controlled with the same control signal. Similarly, the second control circuit 26 may control the ON transistor 23 and the OFF transistor 24 with the same control signal. For example, as shown in FIG. 3, this can be achieved by forming the ON transistor 13 and ON transistor 23 with npn transistors and the OFF transistor 14 and OFF transistor 24 with pnp transistors. In this case, each of the first control circuit 16 and the second control circuit 26 controls the two transistors with a single control signal according to a so-called push-pull system, thereby implementing the operation shown in FIG. 2. This reduces control signal paths in the gate drive device of this preferred embodiment, thus contributing to simplification of the circuit configuration of the gate drive device.

<Second Preferred Embodiment>

Figure 4:
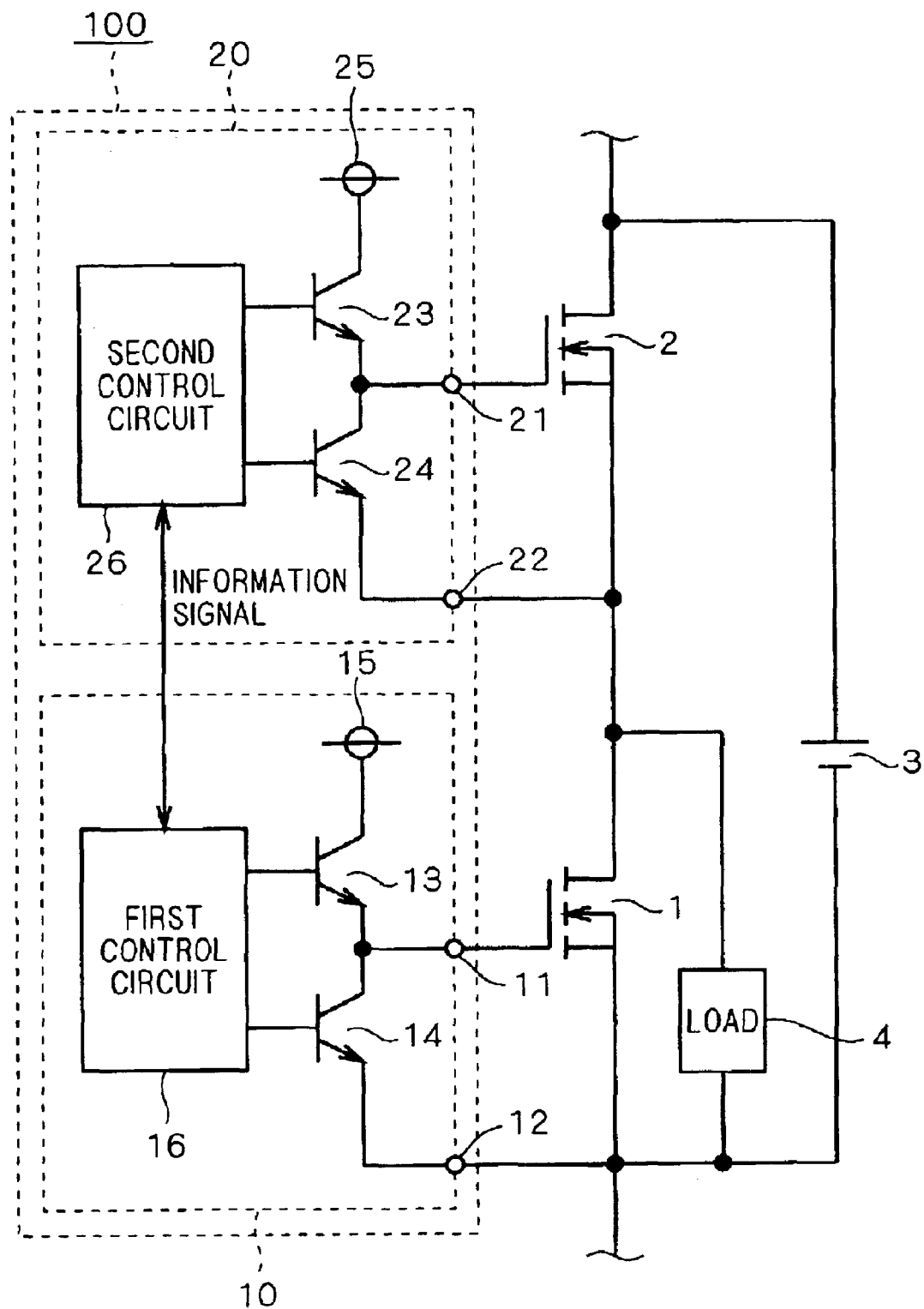
FIG. 4 is a diagram showing the configuration of a gate drive device according to a second preferred embodiment.

FIG. 4 is a diagram showing the configuration of a gate drive device according to a second preferred embodiment. In FIG. 4, the components having the same functions as those of FIG. 1 are shown at the same reference characters and are not described in detail again.

In this preferred embodiment, the first drive circuit 10 and the second drive circuit 20 mutually send/receive information signals indicating the timings of turning on the respective MOS transistors. That is to say, the first control circuit 16 in the first drive circuit 10 sends to the second control circuit 26 in the second drive circuit 20 an information signal about the timing of turning on the first power MOSFET 1 and also monitors the timing of turning on of the second power MOSFET 2 on the basis of an information signal received from the second control circuit 26. Similarly, the second control circuit 26 in the second drive circuit 20 sends to the first control circuit 16 an information signal about the timing of turning on the second power MOSFET 2 and also monitors the timing of turning on of the first power MOSFET 1 on the basis of the information signal received from the first control circuit 16.

The drive circuit 100 of this preferred embodiment operates basically as shown in FIG. 2. However, the first control circuit 16 controls the ON transistor 13 and the OFF transistor 14 on the basis of the information signal received from the second control circuit 26 and temporarily (for about several tens of nanoseconds to one microsecond) places the first power MOSFET 1 in an on state according to the timing of turning on of the second power MOSFET 2. Also, the second control circuit 26 controls the ON transistor 23 and the OFF transistor 24 on the basis of the information signal received from the first control circuit 16 and temporarily (for about several tens of nanoseconds to one microsecond) places the second power MOSFET 2 in an on state according to the timing of turning on of the first power MOSFET 1.

Thus, the first drive circuit 10 and the second drive circuit 20 respectively determine the periods during which the first power MOSFET 1 and the second power MOSFET 2 stay on, on the basis of the information signals they receive. This enables more accurate and more real-time drive control, in addition to the effects of the first preferred embodiment. The operating reliability of the gate drive device 100 of the invention is thus enhanced.

Figure 5:
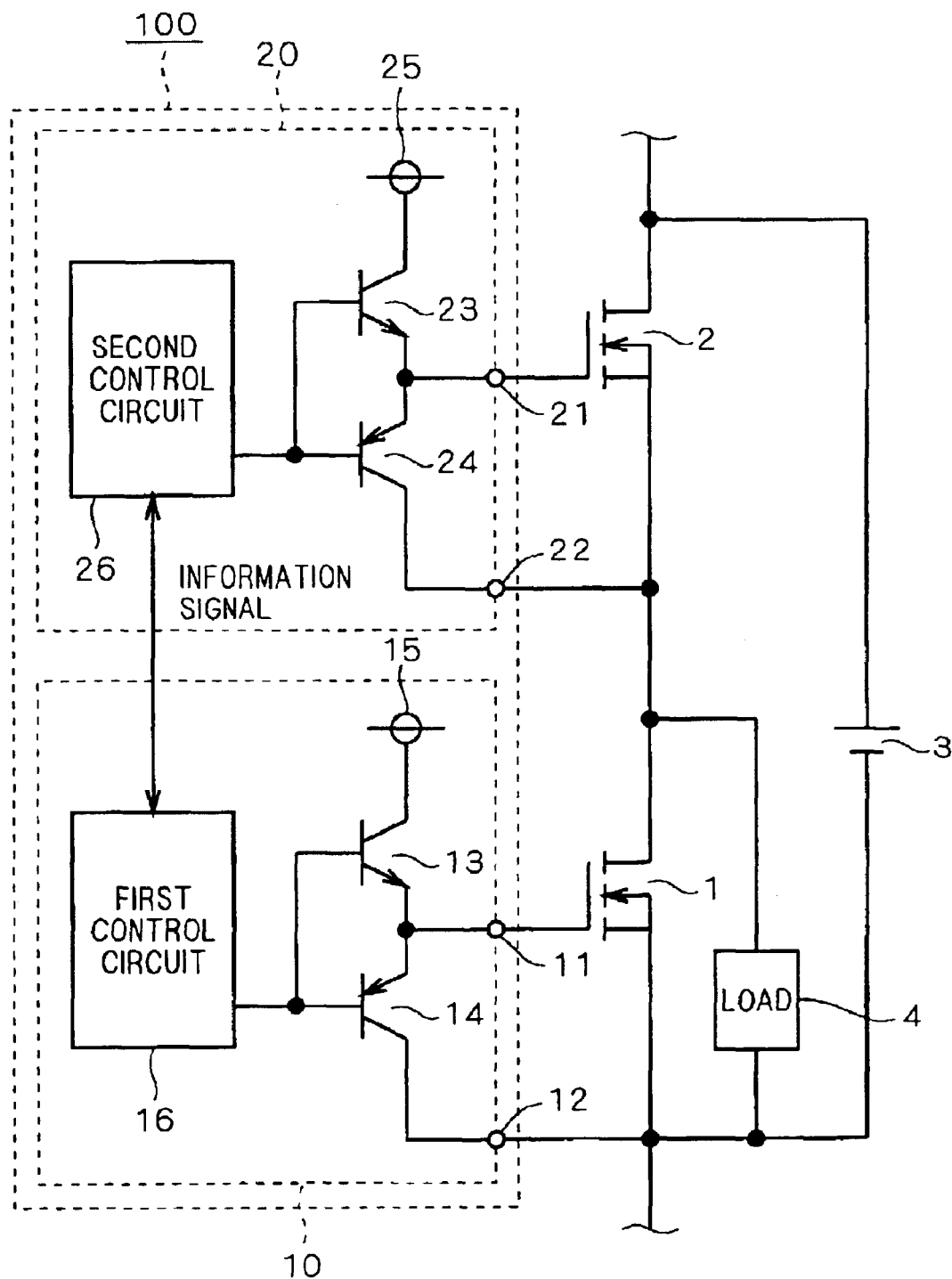
FIG. 5 is a diagram showing a modification of the gate drive device of the second preferred embodiment.

In this preferred embodiment, too, as shown in FIG. 5, for example, the ON transistors 13 and 23 may be npn transistors and the OFF transistors 14 and 24 may be pnp transistors, so that each of the first control circuit 16 and the second control circuit 26 can control the two transistors with the same control signal. It is clear that such a configuration can operate as shown in FIG. 2. This reduces control signal paths in the gate drive device of this preferred embodiment, thereby contributing to simplification of the circuit configuration of the gate drive device.

<Third Preferred Embodiment>

FIG. 6 is a diagram showing the configuration of a power MOS transistor gate drive device according to a third preferred embodiment. In FIG. 6, the components having the same functions as those of FIG. 1 are shown at the same reference characters.

In this preferred embodiment, the first drive circuit 10 for driving the first power MOSFET 1 has, between the gate connection terminal 11 and the source connection terminal 12, the OFF transistor 14, and an MOSFET 17 as a third switching element and a resistor 18 that are connected in parallel to the OFF transistor 14. The MOSFET 17 and the resistor 18 are series-connected to each other. It also has the ON transistor 13 connected between the driving voltage source 15 as a first voltage source and the gate connection terminal 11. In this preferred embodiment, the first control circuit 16 controls the switching on/off of the ON transistor 13 and OFF transistor 14, and the MOSFET 17. The first control circuit 16 further has a function as a second voltage source and also controls the switching on/off of the output of a predetermined voltage G1. The output terminal for the voltage G1 from the first control circuit 16 is connected to the gate connection terminal 11.

As can be seen from FIG. 6, the second drive circuit 20 for driving the second power MOSFET 2 is configured in almost the same way as the first drive circuit 10. That is to say, the second drive circuit 20 has, between the gate connection terminal 21 and the source connection terminal 22, the OFF transistor 24, and an MOSFET 27 as a third switching element and a resistor 28 that are connected in parallel to the OFF transistor 24. The MOSFET 27 and the resistor 28 are series-connected to each other. It also has the ON transistor 23 connected between the driving voltage source 25 as a first voltage source and the gate connection terminal 21. The second control circuit 26 controls the switching on/off of the ON transistor 23 and the OFF transistor 24, and the MOSFET 27, and also controls, as a second voltage source, the switching on/off of the output of predetermined voltage GI. The output terminal for the voltage G1 from the second control circuit 26 is connected to the gate connection terminal 21.

Figure 7:
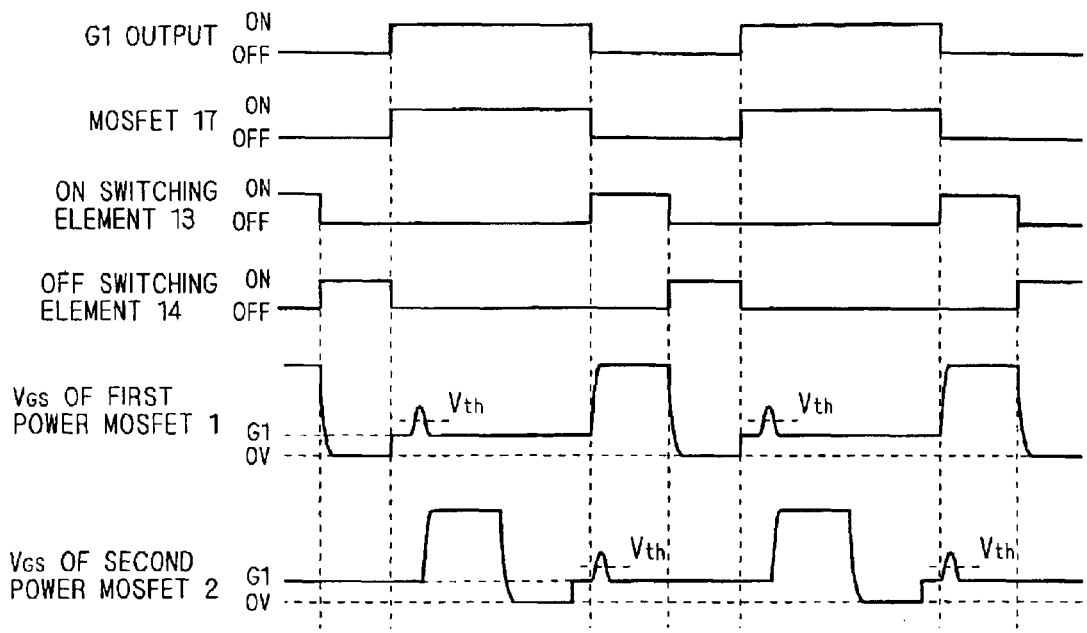
FIG. 7 is a diagram used to describe operation of the gate drive device of the third preferred embodiment.

FIG. 7 is a diagram used to describe the operation of the gate drive device 100 of this preferred embodiment. The operation of the gate drive device 100 of this preferred embodiment is now described referring to FIG. 7. Note that, though the description focuses on the operation of the first drive circuit 10 for the sake of simplicity, the second drive circuit 20 operates in the same way.

First, in the first drive circuit 10, as shown in FIG. 7, the first control circuit 16 turns off the ON transistor 13 and turns on the OFF transistor 14, and then the gate-source voltage ($V_{GS}$) of the first power MOSFET 1 becomes 0 V and the first power MOSFET 1 thus turns off. At this point, since no diode is interposed between the ON transistor 13 and the source of the first power MOSFET 1 (the source connection terminal 12), the gate-source voltage of the first power MOSFET 1 quickly drops to 0 V. This prevents increased switching loss at the time the first power MOSFET 1 turns off.

Subsequently, before the second power MOSFET 2 turns on, the first control circuit 16 turns off the OFF transistor 14 and turns on the MOSFET 17, with the ON transistor 13 remaining off, and outputs the predetermined voltage G1. As a result, the gate-source voltage ($V_{GS}$) of the first power MOSFET 1 attains the voltage G1. The value of the voltage G1 is set to be slightly less than the threshold voltage $V_{th}$ at which the first power MOSFET 1 turns on.

After that, the second drive circuit 20 applies the driving voltage between the gate and source of the second power MOSFET 2 with predetermined timing, so as to turn it on. At this point, because of an influence of a current variation (di/dt) that takes place in the inverter circuit as the second power MOSFET 2 turns on, a voltage variation occurs between the gate and source of the first power MOSFET 1 as shown in FIG. 7, which causes the gate-source voltage of the first power MOSFET 1 to temporarily exceed the threshold $V_{th}$, whereby the first power MOSFET 1 is placed in an on state during that period. That is, as a consequence, the first drive circuit 10 temporarily turns on the first power MOSFET 1 at the same time that the second power MOSFET 2 turns on. Accordingly, the free-wheeling current that takes place as the second power MOSFET 2 turns on flows not into the parasitic diode portion of the first power MOSFET 1 but into its transistor portion, whereby the surge voltage occurring between the source and drain of the first power MOSFET 1 is reduced.

The second drive circuit 20 operates so that the second power MOSFET 2 temporarily turns on at the same time that the first power MOSFET 1 turns on. As previously stated, its operation is the same as that of the first drive circuit 10 and is not described.

Thus, the gate drive device 100 of this preferred embodiment operates so that, when one of the first power MOSFET 1 and the second power MOSFET 2 is turned off and then the other is turned on after that with a predetermined timing, the aforementioned one MOSFET is temporarily placed in an on state for a predetermined short time period synchronized with that timing. This reduces the surge voltage that is applied to that one power MOSFET as the other MOSFET turns on. Also, since the one MOSFET temporarily turns on utilizing an influence of a current variation caused as the other MOSFET turns on, the drive control can be accurate and real-time, without the need to monitor the timing of turning on of the other MOSFET, as explained in the second preferred embodiment.

Furthermore, increases in switching loss at turning off of the first power MOSFET 1 and second power MOSFET 2 can be prevented since no diode is interposed between the OFF transistor 14 and the source connection terminal 12 and between the OFF transistor 24 and the source connection terminal 22.

<Fourth Preferred Embodiment>

In the third preferred embodiment, the first power MOSFET 1, for example, stays on for only a very short time period in synchronization with the turning on of the second power MOSFET 2. However, as can be seen from FIG. 7, the voltage G1 is applied between the gate and source of the first power MOSFET 1 for a time period that is significantly longer than that short time period. The voltage G1 is set at a value slightly less than the threshold voltage $V_{th}$. With such settings, the gate-source voltages of the first power MOSFET 1 and second power MOSFET 2 exceed the threshold voltage $V_{th}$ because of an influence of a current variation occurring in the inverter circuit, whereby the operation shown in FIG. 7 is implemented. However, in the periods during which the voltage G1 is being applied between the gate and source, the gate-source voltage is prone to exceed the threshold voltage $V_{th}$ even with noise; that is, the first power MOSFET 1 and the second power MOSFET 2 are prone to malfunction.

Figure 8:
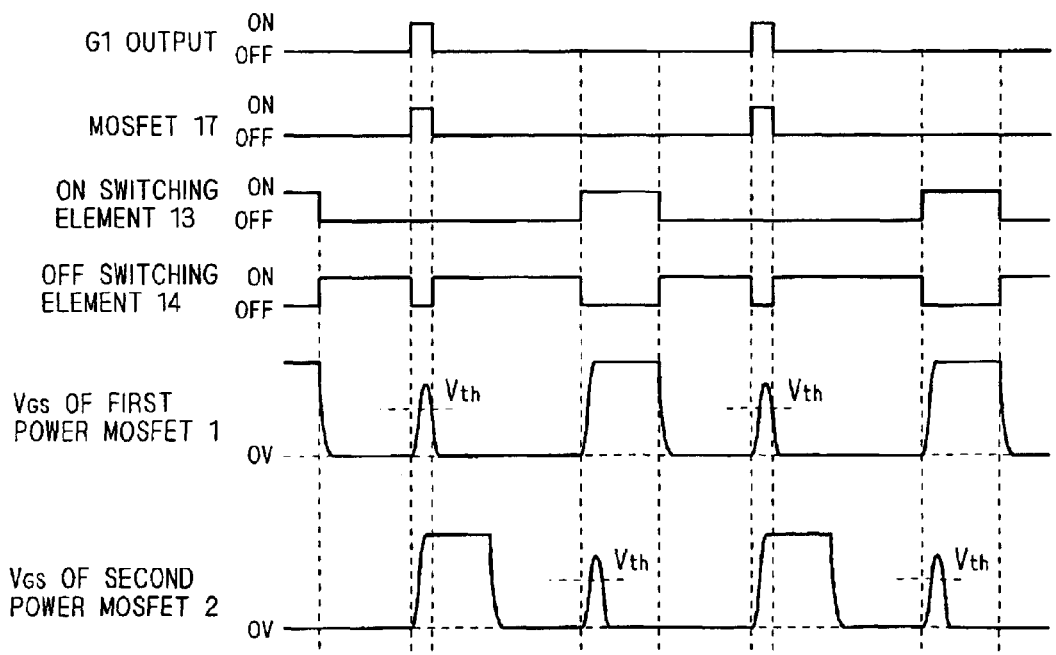
FIG. 8 is a diagram used to describe operation of a gate drive device according to a fourth preferred embodiment.

FIG. 8 is a diagram used to describe the operation of a gate drive device 100 of the fourth preferred embodiment. The operation of the gate drive device 100 of this preferred embodiment is now described referring to FIG. 8. Though the description focuses on the operation of the first drive circuit 10 for the sake of simplicity, the second drive circuit 20 operates in the same way. The configuration of the gate drive device 100 of this preferred embodiment is the same as that shown in FIG. 6 and is not described again here.

First, as shown in FIG. 8, in the first drive circuit 10, the first control circuit 16 turns off the ON transistor 13 and turns on the OFF transistor 14, and then the gate-source voltage ($V_{GS}$) of the first power MOSFET 1 quickly drops to 0 V and the first power MOSFET 1 thus turns off. Subsequently, the second drive circuit 20 applies the driving voltage between the gate and source of the second power MOSFET 2 with predetermined timing.

Then, with the same timing, the first control circuit 16 in the first drive circuit 10 temporarily turns on the MOSFET 17 and turns off the OFF transistor 14 (the ON transistor 13 remains off) and outputs the predetermined voltage G1. The voltage G1 is thus applied between the gate and source of the first power MOSFET 1. The value of the voltage G1 is set to be slightly less than the threshold voltage $V_{th}$ at which the first power MOSFET 1 turns on. However, because of an influence of a current variation (di/dt) that takes place in the inverter circuit as the second power MOSFET 2 turns on, the gate-source voltage of the first power MOSFET 1 varies over the voltage G1 as shown in FIG. 8 and temporarily exceeds the threshold $V_{th}$, whereby the first power MOSFET 1 is placed in an on state during that period.

That is, as a result, the first drive circuit 10 temporarily turns on the first power MOSFET 1 at the same time that the second power MOSFET 2 turns on. This reduces the surge voltage occurring between the source and drain of the first power MOSFET 1, as in the third preferred embodiment.

The second drive circuit 20 operates so that the second power MOSFET 2 temporarily turns on at the same time that the first power MOSFET 1 turns on. As previously stated, its operation is the same as that of the first drive circuit 10 and is not described again here.

Thus, when one of the first and second power MOSFETs 1 and 2 is turned off and then the other is turned on with a predetermined timing, the gate drive device 100 of this preferred embodiment applies predetermined voltage G1 between the gate and source of that one MOSFET only for a short time period synchronized with that predetermined timing, so as to temporarily place that one MOSFET in an on state.

That is to say, the length of periods during which the predetermined voltage G1 is applied between the gate and source of one MOSFET (i.e. periods in which malfunction is apt to occur due to noise) is minimized, which enhances noise resistance of the gate drive device 100 as compared with that of the third preferred embodiment. This also suppresses power consumption of operation of the gate drive device 100. Furthermore, needless to say, the surge voltage applied to the first power MOSFET 1 and second power MOSFET 2 can be reduced as in the third preferred embodiment.

Figure 9:
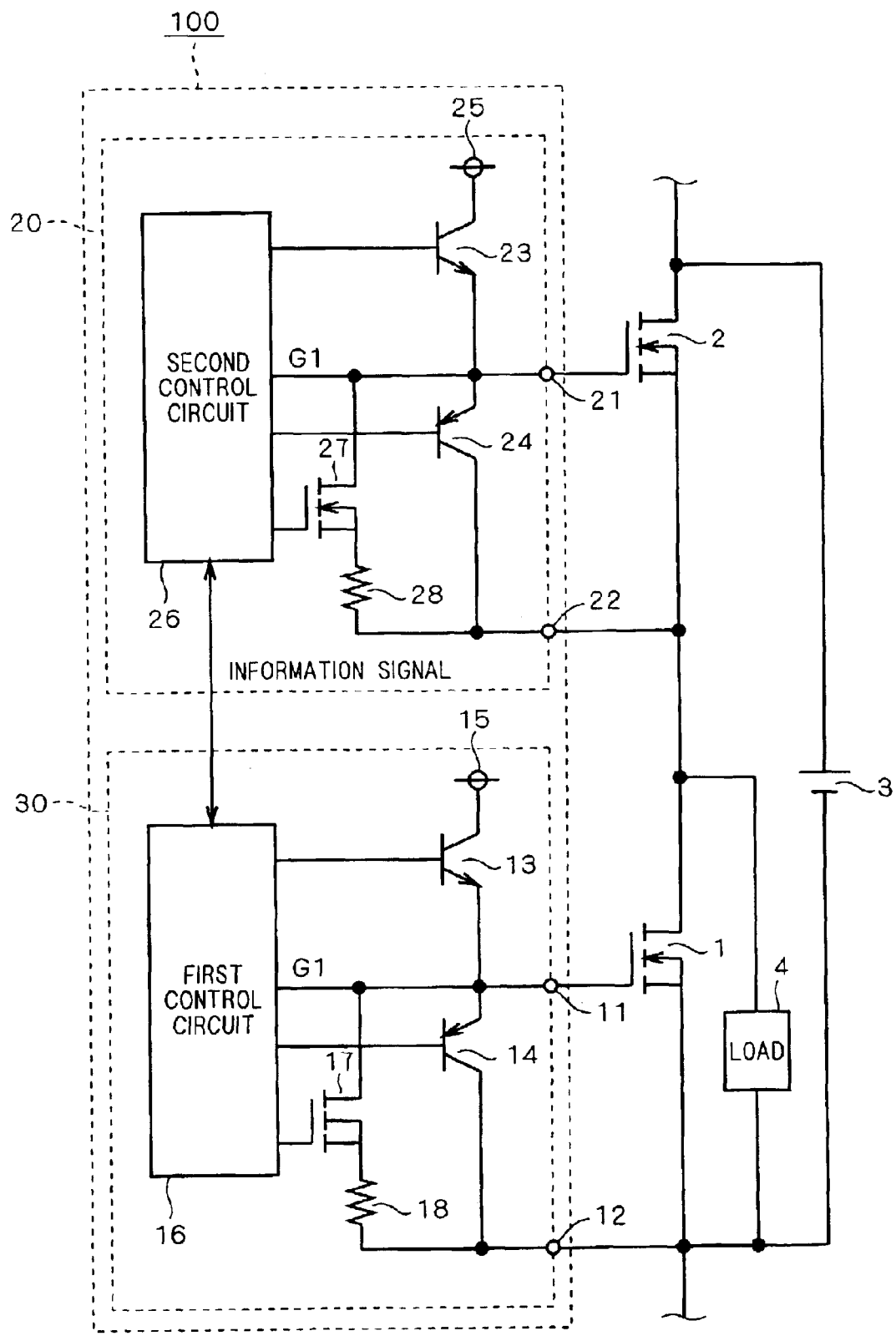
FIG. 9 is a diagram showing a modification of the gate drive device of the fourth preferred embodiment.

Also in this preferred embodiment, the first drive circuit 10 and the second drive circuit 20 may be configured, as shown in FIG. 9, so that they mutually send/receive information signals indicating timings of turning on of the respective MOS transistors. Then, as in the second preferred embodiment, the first drive circuit 10 and the second drive circuit 20 respectively determine the periods during which the first power MOSFET 1 and the second power MOSFET 2 stay on, on the basis of the information signals they receive. This enables more accurate and more real-time drive control. The operating reliability of the gate drive device 100 of the invention is thus enhanced.

<Fifth Preferred Embodiment>

FIG. 10 is a diagram showing the configuration of a power MOS transistor gate drive device according to a fifth preferred embodiment of the invention. The components having the same functions as those of FIG. 1 are shown at the same reference characters.

In this preferred embodiment, the first drive circuit 10 for driving the first power MOSFET 1 has, between the gate connection terminal 11 and the source connection terminal 12, the OFF transistor 14, and the MOSFET 17 as a third switching element and the resistor 18 that are connected in parallel to the OFF transistor 14. The MOSFET 17 and the resistor 18 are series-connected to each other. Also, the ON transistor 13, and a resistor 19 series-connected thereto, are connected between the driving voltage source 15 and the gate connection terminal 11. In this preferred embodiment, the first control circuit 16 controls the switching on/off of the ON transistor 13 and OFF transistor 14, and the MOSFET 17.

As can be seen from FIG. 10, the second drive circuit 20 for driving the second power MOSFET 2 is configured in almost the same way as the first drive circuit 10. That is to say, the second drive circuit 20 has, between the gate connection terminal 21 and the source connection terminal 22, the OFF transistor 24, and the MOSFET 27 as a third switching element and the resistor 28 that are connected in parallel to the OFF transistor 24. The MOSFET 27 and the resistor 28 are series-connected to each other. Also, ON transistor 23, and a resistor 29 series-connected thereto, are connected between the driving voltage source 25 and the gate connection terminal 21. The second control circuit 26 controls the switching on/off of the MOSFET 27, as well as of the ON transistor 23 and the OFF transistor 24.

FIG. 11 is a diagram used to describe the operation of the gate drive device 100 of this preferred embodiment. The operation of the gate drive device 100 is now described referring to FIG. 11. Note that, though the description focuses on the operation of the first drive circuit 10 for the sake of simplicity, the second drive circuit 20 operates in the same way.

First, in the first drive circuit 10, as shown in FIG. 11, the first control circuit 16 turns off the ON transistor 13 and turns on the OFF transistor 14, and then the gate-source voltage ($V_{GS}$) of the first power MOSFET 1 becomes 0 V and the first power MOSFET 1 thus turns off. At this point, since no diode is interposed between the ON transistor 13 and the source of the first power MOSFET 1 (the source connection terminal 12), the gate-source voltage of the first power MOSFET 1 quickly drops to 0 V. This prevents an increase in switching loss at the time when the first power MOSFET 1 turns off.

Subsequently, before the second power MOSFET 2 turns on, the first control circuit 16 turns on the ON transistor 13 and MOSFET 17 and turns off the OFF transistor 14. As a result, the gate-source voltage ($V_{GS}$) of the first power MOSFET 1 attains a voltage G2 that is a fraction of the driving voltage from the driving voltage source 15 divided by the resistors 18 and 19, relative to the source connection terminal 12. The resistance values of the resistors 18 and 19 are set so that the voltage G2 is slightly less than the threshold voltage $V_{th}$ at which the first power MOSFET 1 turns on.

After that, the second drive circuit 20 applies the driving voltage between the gate and source of the second power MOSFET 2 with predetermined timing, so as to turn it on. At this point, because of an influence of a current variation (di/dt) that occurs in the inverter circuit at the turning on, a voltage variation occurs between the gate and source of the first power MOSFET 1 as shown in FIG. 11 and the gate-source voltage. temporarily exceeds the threshold $V_{th}$, whereby the first power MOSFET 1 is placed in an on state during that period.

That is, as a consequence, the first drive circuit 10 temporarily turns on the first power MOSFET 1 at the same time that the second power MOSFET 2 turns on. Accordingly, the free-wheeling current occurring as the second power MOSFET 2 turns on flows not into the parasitic diode portion of the first power MOSFET 1 but into its transistor portion, whereby the surge voltage occurring between the source and drain of the first power MOSFET 1 is reduced.

The second drive circuit 20 operates so that the second power MOSFET 2 temporarily turns on at the same time that the first power MOSFET 1 turns on. As previously stated, its operation is the same as that of the first drive circuit 10 and is not described again here.

In this way, the gate drive device 100 of this preferred embodiment operates so that, when one of the first and second power MOSFETs 1 and 2 is turned off and then the other is turned on after that with a predetermined timing, the aforementioned one MOSFET is temporarily placed in an on state for a predetermined short time period synchronized with that timing. This reduces the surge voltage applied to that one power MOSFET as the other MOSFET turns on. Also, since that one MOSFET temporarily turns on utilizing an influence of a current variation that occurs as the other MOSFET turns on, the drive control can be accurate and real-time, without the need to monitor the timing of turning on of the other MOSFET, as explained in, e.g. the second preferred embodiment.

While, in the fourth preferred embodiment, the first drive circuit 10 and the second drive circuit 20 each need first and second voltage sources, the first and second drive circuits 10 and 20 of this preferred embodiment each need a single voltage source (the driving voltage sources 15 and 25). This contributes to simplification of the circuit configuration of the drive device.

Figure 12:
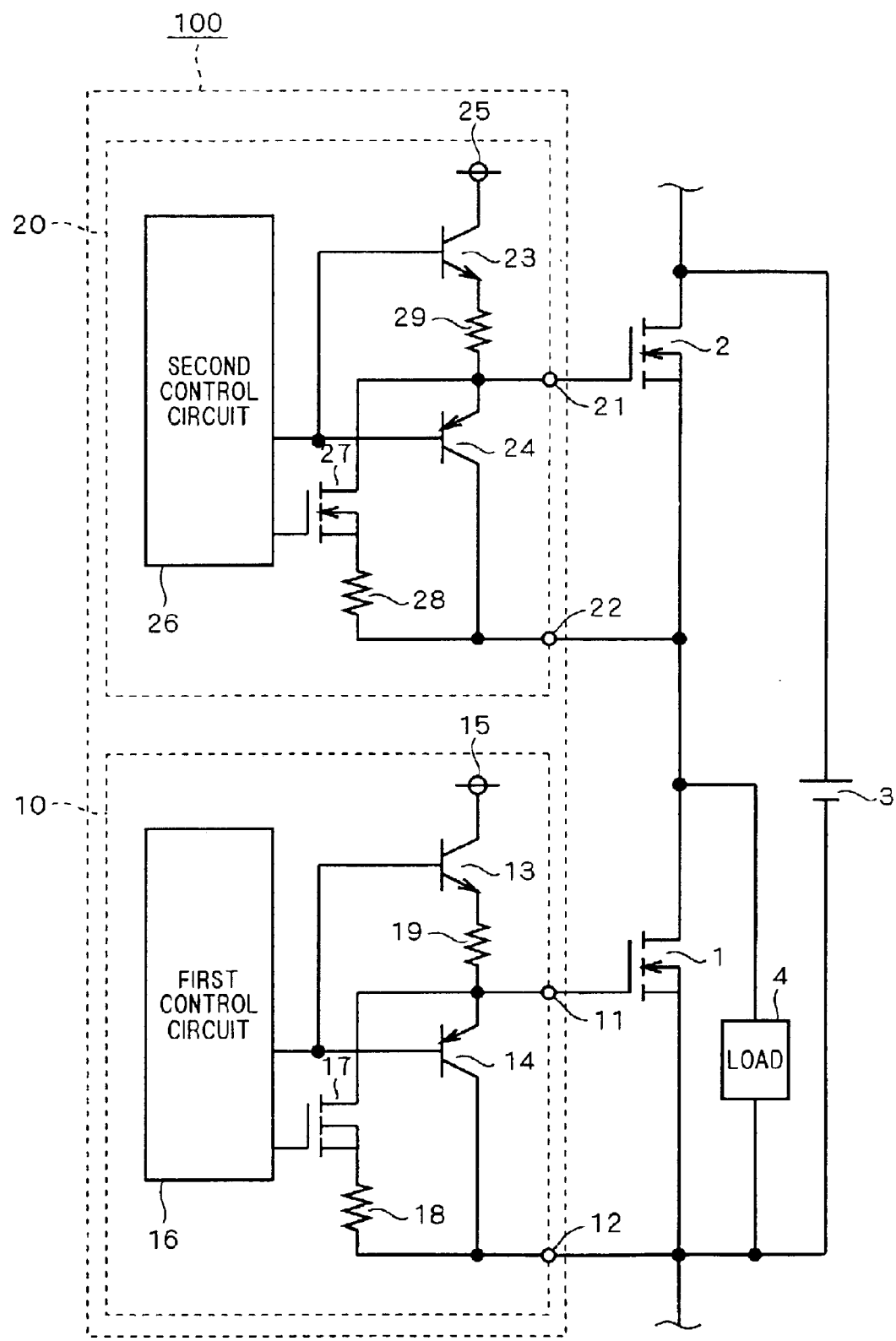
FIG. 12 is a diagram showing a modification of the gate drive device of the fifth preferred embodiment.

Also, as shown in FIG. 12, for example, each of the first control circuit 16 and the second control circuit 26 may be configured to control the two transistors with a single control signal, with the ON transistor 13 and ON transistor 23 being npn transistors and the OFF transistor 14 and OFF transistor 24 being pnp transistors. Such a configuration, too, can perform the operation shown in FIG. 11. This reduces control signal paths and contributes to further simplification of the circuit configuration of the gate drive device.

Sixth Preferred Embodiment

In the fifth preferred embodiment, the voltage G2 is set at a value slightly less than the threshold voltage $V_{th}$. By this setting, the gate-source voltages of the first power MOSFET 1 and second power MOSFET 2 exceed the threshold voltage $V_{th}$ because of an influence of a current variation in the inverter circuit, whereby the operation shown in FIG. 11 is implemented. However, in the periods during which the voltage G2 is being applied between the gate and source, the first power MOSFET 1 and the second power MOSFET 2 are prone to malfunction with noise.

Figure 13:
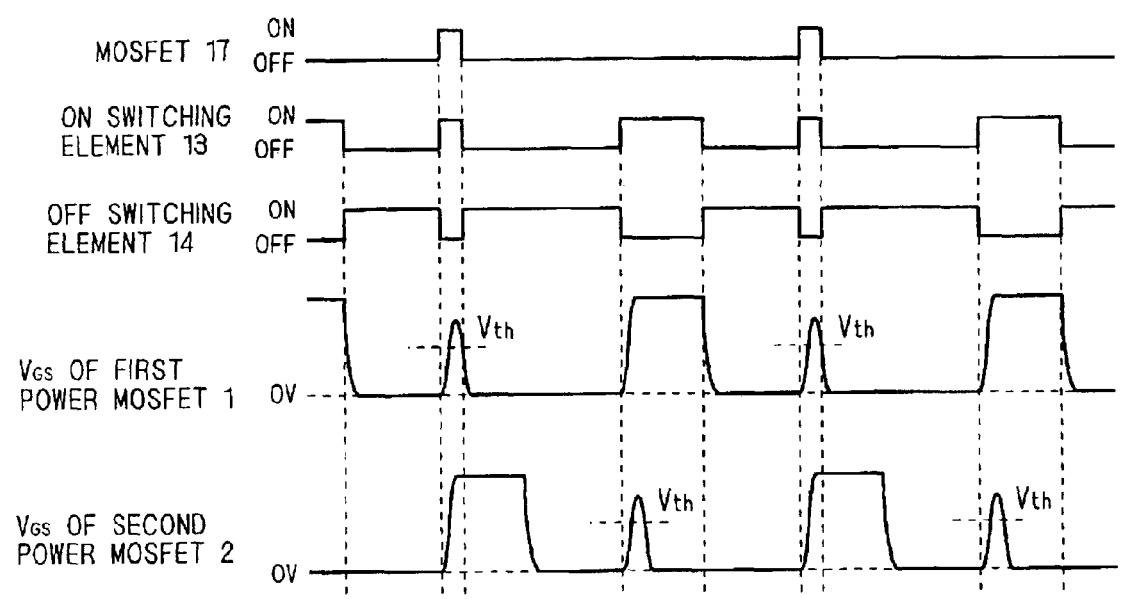
FIG. 13 is a diagram used to describe operation of a gate drive device according to a sixth preferred embodiment.

FIG. 13 is a diagram used to describe the operation of the gate drive device 100 of this preferred embodiment. The operation of the gate drive device 100 of this preferred embodiment is now described referring to FIG. 13. While, for the sake of simplification, the description focuses on the operation of the first drive circuit 10, the second drive circuit 20 operates in the same way. The configuration of the gate drive device 100 of this preferred embodiment is the same as that shown in FIG. 10 and is not described again here.

First, as shown in FIG. 13, in the first drive circuit 10, the first control circuit 16 turns off the ON transistor 13 and turns on the OFF transistor 14, and then the gate-source voltage ($V_{GS}$) of the first power MOSFET 1 quickly drops to 0 V and the first power MOSFET 1 thus turns off. Subsequently, the second drive circuit 20 applies the driving voltage between the gate and source of the second power MOSFET 2 according to predetermined timing, thereby turning it on.

Then, with the same timing, the first control circuit 16 in the first drive circuit 10 temporarily turns on the ON transistor 13 and the MOSFET 17 and turns off the OFF transistor 14. As a result, a voltage G2 is applied between the gate and source of the first power MOSFET 1, the voltage G2 being a fraction of the driving voltage from the driving voltage source 15 divided by the resistors 18 and 19, relative to the source connection terminal 12. Here again, the voltage G2 is set at a value slightly smaller than the threshold voltage $V_{th}$. However, because of an influence of a current variation (di/dt) that takes place in the inverter circuit as the second power MOSFET 2 turns on, the gate-source voltage of the first power MOSFET 1 becomes more than the voltage G2 as shown in FIG. 13 and temporarily exceeds the threshold $V_{th}$, whereby the first power MOSFET 1 is placed in an on state during this period.

That is, as a result, the first drive circuit 10 temporarily turns on the first power MOSFET 1 at the same time that the second power MOSFET 2 turns on. As in the fifth preferred embodiment, this reduces the surge voltage occurring between the source and drain of the first power MOSFET 1.

The second drive circuit 20 operates so that the second power MOSFET 2 temporarily turns on at the same time that the first power MOSFET 1 turns on. As previously stated, its operation is the same as that of the first drive circuit 10 and is not described again here.

As shown above, when one of the first and second power MOSFETs 1 and 2 is turned off and then the other is turned on with a predetermined timing, the gate drive device 100 of this preferred embodiment applies predetermined voltage G2 between the gate and source of the aforementioned one MOSFET only for a short period synchronized with the predetermined timing, so as to temporarily place that one MOSFET in an on state.

That is to say, the periods during which the predetermined voltage G2 is applied between the gate and source of one MOSFET (i.e. the periods in which malfunction is apt to occur with noise) are minimized, which enhances noise resistance of the gate drive device 100 as compared with that of the fifth preferred embodiment. This also suppresses power consumption of operation of the gate drive device 100. Furthermore, needless to say, as in the fifth preferred embodiment, the surge voltages applied to the first power MOSFET 1 and second power MOSFET 2 can be reduced.

Also in this preferred embodiment, the first drive circuit 10 and the second drive circuit 20 may be configured, as shown in FIG. 14, so that they mutually send/receive information signals indicating timing of turning on of the respective MOS transistors. Then, as in the second preferred embodiment, the first drive circuit 10 and the second drive circuit 20 respectively determine the periods during which the first power MOSFET 1 and the second power MOSFET 2 stay on, on the basis of information signals they receive. This enables more accurate and more real-time drive control. The operating reliability of the gate drive device 100 of the invention is thus enhanced.

While the invention has been described in detail, the foregoing description is in all aspects illustrative and not restrictive. It is understood that numerous other modifications and variations can be devised without departing from the scope of the invention.

What is claimed is:

1. A gate drive device for driving first and second MOS transistors that are series-connected to each other, said gate drive device comprising first and second drive circuits for driving said first and second MOS transistors, respectively, wherein said first and second drive circuits operate so that, when one of said first and second MOS transistors is turned off and then the other is turned on after that with a predetermined timing, said one MOS transistor is temporarily placed in an on state for a predetermined time period that is synchronized with said predetermined timing.

2. The gate drive device according to claim 1, wherein each of said first and second drive circuits is capable of mutually sending and receiving an information signal about timing of turning on of the corresponding MOS transistor and determines said predetermined time period on the basis of said information signal received.

3. The gate drive device according to claim 1, wherein each of said first and second drive circuits comprises, first and second terminals that are connectable respectively to a gate and a source of said corresponding MOS transistor, a voltage source for supplying a driving voltage for driving said corresponding MOS transistor, a first switching element connected between said voltage source and said first terminal, a second switching element connected between said first terminal and said second terminal, and a control circuit for controlling said first and second switching elements, and wherein said control circuit provided in one of said first and second drive circuits that drives said one MOS transistor places said first switching element in an on state and said second switching element in an off state during said predetermined time period.

4. The gate drive device according to claim 3, wherein each said control circuit controls said corresponding first and second switching elements with a same control signal.

5. The gate drive device according to claim 1, wherein each of said first and second drive circuits comprises, first and second terminals that are connectable respectively to a gate and a source of said corresponding MOS transistor, a first voltage source for supplying a driving voltage for driving said corresponding MOS transistor, a second voltage source connected to said first terminal, for supplying a predetermined voltage that is less than a threshold voltage at which said corresponding MOS transistor turns on, a first switching element connected between said first voltage source and said first terminal, a second switching element connected between said first terminal and said second terminal, a third switching element and a resistor parallel-connected to said second switching element and series-connected to each other, and a control circuit for controlling said first, second, and third switching elements and said second voltage source, and wherein, during said predetermined time period, said control circuit provided in one of said first and second drive circuits that drives said one MOS transistor places said first and second switching elements in an off state and said third switching element in an on state and applies said predetermined voltage from said second voltage source to said first terminal.

6. A gate drive device having a drive circuit for driving an MOS transistor, said drive circuit comprising, first and second terminals that are connectable respectively to a gate and a source of said MOS transistor, a first voltage source for supplying a driving voltage for driving said MOS transistor, a second voltage source connected to said first terminal, for supplying a predetermined voltage that is less than a threshold voltage at which said MOS transistor turns on, a first switching element connected between said first voltage source and said first terminal, a second switching element connected between said first terminal and said second terminal, a third switching element and a resistor parallel-connected to said second switching element and series-connected to each other, and a control circuit for controlling said first, second, and third switching elements and said second voltage source, wherein, with a predetermined timing after turning off said first switching element and turning on said second switching element, and for a predetermined time period, said control circuit temporarily places said first and second switching elements in an off state and said third switching element in an on state and applies said predetermined voltage from said second voltage source to said first terminal.

7. The gate drive device according to claim 6, wherein said control circuit can send/receive an information signal about timing of turning on of said MOS transistor and determines said predetermined time period on the basis of said information signal received.

* * * * *